(12) United States Patent
Song et al.

(10) Patent No.: US 9,837,479 B2
(45) Date of Patent: Dec. 5, 2017

(54) ARRAY SUBSTRATE AND FABRICATION METHOD THEREOF, DISPLAY DEVICE

(71) Applicant: BOE TECHNOLOGY GROUP CO., LTD., Beijing (CN)

(72) Inventors: Young Suk Song, Beijing (CN); Seong Yeol Yoo, Beijing (CN); Seung Jin Choi, Beijing (CN); Hee Cheol Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/102,716

(22) Filed: Dec. 11, 2013

(65) Prior Publication Data

US 2014/0159016 A1 Jun. 12, 2014

(30) Foreign Application Priority Data

Dec. 12, 2012 (CN) .......................... 2012 1 0537136

(51) Int. Cl.
*H01L 29/08* (2006.01)
*H01L 27/32* (2006.01)

(52) U.S. Cl.
CPC ........ *H01L 27/3272* (2013.01); *H01L 27/322* (2013.01)

(58) Field of Classification Search
CPC ............. H01L 27/3246; H01L 51/0005; H01L 27/3272; H01L 27/322

(Continued)

(56) References Cited

U.S. PATENT DOCUMENTS

| | | | |
|---|---|---|---|
| 6,608,439 B1 * | 8/2003 | Sokolik ................. | B82Y 20/00 313/504 |
| 7,106,285 B2 * | 9/2006 | Naugler ............... | G09G 3/3233 345/76 |

(Continued)

FOREIGN PATENT DOCUMENTS

| CN | 102082166 A | 6/2011 |
|---|---|---|
| CN | 202957246 U | 5/2013 |

(Continued)

OTHER PUBLICATIONS

First Chinese Office Action dated Nov. 15, 2014; Appln. No. 201210537136.7.

(Continued)

*Primary Examiner* — Trung Q Dang
*Assistant Examiner* — Patricia Reddington
(74) *Attorney, Agent, or Firm* — Ladas & Parry LLP

(57) ABSTRACT

Embodiments of the invention disclose an array substrate and a fabrication method thereof, and a display device. The array substrate comprises a plurality of pixel units disposed on a base substrate, and the pixel unit comprises a thin-film transistor structure region and a display region other than the thin-film transistor structure region. A thin-film transistor structure is formed in the thin-film transistor structure region, an organic light-emitting diode is formed in the display region, and the thin-film transistor structure is configured to drive the organic light-emitting diode. A light-shielding layer is formed above the thin-film transistor structure in the thin-film transistor structure region, and the light-shielding layer is configured to block a blue light from entering the thin-film transistor structure.

20 Claims, 3 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2005/0073243 A1* | 4/2005 | Yamazaki | H01L 27/3246 313/498 |
| 2005/0161740 A1 | 7/2005 | Park et al. | |
| 2005/0269942 A1 | 12/2005 | Ahn et al. | |
| 2007/0013282 A1* | 1/2007 | Okutani | H01L 27/322 313/111 |
| 2008/0230775 A1* | 9/2008 | Rhee et al. | 257/40 |
| 2010/0102320 A1 | 4/2010 | Chung et al. | |
| 2011/0121299 A1 | 5/2011 | Kim et al. | |
| 2011/0127505 A1* | 6/2011 | Nakamura | H01L 51/5088 257/40 |
| 2011/0127508 A1* | 6/2011 | Omrane | H01G 4/005 257/40 |
| 2011/0263088 A1* | 10/2011 | Yin et al. | 438/268 |
| 2012/0056184 A1* | 3/2012 | Park | H01L 27/3272 257/59 |
| 2012/0099059 A1 | 4/2012 | Kim et al. | |
| 2013/0193843 A1* | 8/2013 | Yan | H05B 33/22 313/504 |
| 2014/0042396 A1* | 2/2014 | Yang et al. | 257/40 |
| 2014/0077204 A1* | 3/2014 | Saito | H01L 27/1225 257/43 |

FOREIGN PATENT DOCUMENTS

| | | |
|---|---|---|
| JP | 2010-010020 A | 1/2010 |
| JP | 2010-117398 A | 5/2010 |
| KR | 20070075920 A | 7/2007 |

OTHER PUBLICATIONS

Third Chinese Office Action Appln. No. 201210537136.7; dated Jul. 10, 2015.

Second Chinese Office Action Appln. No. 201210537136; dated Apr. 1, 2015.

Extended European Search Report dated Mar. 3, 2017; Appln. No. 13196376.1-1552/2743988.

* cited by examiner

ARRAY SUBSTRATE AND FABRICATION METHOD THEREOF, DISPLAY DEVICE

TECHNICAL FIELD

Embodiments of the invention relate to an array substrate and a fabrication method thereof, and a display device.

BACKGROUND

Organic Light-Emitting Diode (OLED) has the advantages of simple fabrication process, low cost, capable of adjusting color of the emitted light in the visible region, easy for mass production, good flexibility and the like, and thus an OLED display device using the OLED is regarded as one of the most promising display technologies in the future. White OLED (WOLED) has a power efficiency over 60 lm/W and a lifetime of 20,000 hours or more, which greatly promotes the development of the WOLED display device.

The OLED display device comprises a plurality of pixel units, and each pixel unit comprises an OLED and a thin film transistor for driving the OLED. However, the light emitted from the OLED may adversely affect the characteristics of the thin-film transistor (e.g., an oxide thin-film transistor), resulting a deterioration of the display effect of the OLED display device. FIG. 1 is a diagram showing the relationship between the wavelengths of a red light, a green light, a blue light and a mixed light (c light) mixed by the red, green and blue light and the transmittance. It is found that the light with a shorter wavelength (e.g., the blue light, especially the blue light with a wavelength of 400 nm or less) among the light emitted from WOLED has a greater impact on the characteristics of the thin-film transistor (e.g., an oxide thin-film transistor), a leakage current is generated due to the light irradiation, and thus the display effect is deteriorated. Therefore, it is especially necessary to avoid the adverse impact of the light with shorter wavelength on the thin-film transistor.

SUMMARY

According to one aspect of the invention, an array substrate is provided. The array substrate comprises a plurality of pixel units disposed on a base substrate, and the pixel unit comprises a thin-film transistor structure region and a display region other than the thin-film transistor structure region. A thin-film transistor structure is formed in the thin-film transistor structure region, an organic light-emitting diode is formed in the display region, and the thin-film transistor structure is configured to drive the organic light-emitting diode. A light-shielding layer is formed above the thin-film transistor structure in the thin-film transistor structure region, and the light-shielding layer is configured to block a blue light from entering the thin-film transistor structure.

For example, the light-shielding layer is configured to block the blue light with a wavelength of 400 nm or less.

For example, the light-shielding layer is a red filter.

For example, the red filter has a thickness of 5000 Å~40000 Å.

For example, the light-shielding layer is a green filter.

For example, the green filter has a thickness of 5000 Å~40000 Å.

For example, the light-shielding layer is a laminated structure of red and green filters.

For example, the laminated structure of red and green filters has a thickness of 5000 Å~80000 Å.

For example, a color filter film is further formed in the display region, and the color filter film is disposed below the organic light-emitting diode.

For example, the light-shielding layer and the color filter film are provided in a same layer.

For example, the pixel units comprise a red pixel unit, and the color filter film in the red pixel unit is a red color filter film; the light-shielding layer is formed by a red filter, and the red filter is formed at the same time as the color filter film in the red pixel unit.

For example, the pixel units comprise a green pixel unit, and the color filter film in the green pixel unit is a green color filter film; the light-shielding layer is formed by a green filter, and the green filter is formed at the same time as the color filter film in the green pixel unit.

For example, the pixel units comprise a red pixel unit and a green pixel unit, the color filter film in the red pixel unit is a red color filter film, and the color filter film in the green pixel unit is a green color filter film; the light-shielding layer is formed by a laminated structure of red and green filters, and the laminated structure of red and green filters is formed at the same time as the color filter film in the red pixel unit and the color filter film in the green pixel unit.

For example, the array substrate further comprises a passivation layer, the passivation layer is disposed on the thin-film transistor structure, and the light-shielding layer and the color filter film are formed on the passivation layer; a via hole is formed in the passivation layer so that the organic light-emitting diode is connected to the thin-film transistor structure through the via hole.

For example, the array substrate further comprises a resin layer formed on the light-shielding layer and color filter film; a via hole is formed in the resin layer so that the organic light-emitting diode is connected to the thin-film transistor structure through the via hole.

For example, the thin-film transistor structure comprises: a first gate electrode and a second gate electrode formed on the base substrate; a gate insulating layer formed on the first gate electrode and the second gate electrode; a first active layer and a second active layer formed on the gate insulating layer; an insulating isolation layer formed on the first active layer and the second active layer; a first source electrode and a first drain electrode formed on the insulating isolation layer and corresponding to the first active layer, and a second source electrode and a second drain electrode formed on the insulating isolation layer and corresponding to the second active layer. The first drain electrode is connected to the second gate electrode, the first gate electrode, the gate insulating layer, the first active layer, the insulating isolation layer, the first source electrode and first drain electrode form a switching thin-film transistor, the second gate electrode, the gate insulating layer, the second active layer, the insulating isolation layer, the second source electrode and the second drain electrode form a driving thin-film transistor. The organic light-emitting diode comprises a transparent first electrode, a light-emitting layer and a second electrode, and the first electrode is connected to the second drain electrode.

For example, the array substrate further comprises a pixel define layer formed on the first electrode.

According to another aspect of the invention, a display device is provided. The display device comprises the array substrate as described above.

According to yet another aspect of the invention, a fabrication method of an array substrate is provided. The array substrate comprises a plurality of pixel units formed on a base substrate. The pixel unit comprises a thin-film transistor structure region and a display region other than the thin-film transistor structure region. The method comprises: forming a thin-film transistor structure in the thin-film transistor structure region, forming an organic light-emitting diode in the display region, wherein the thin-film transistor structure is configured to drive the organic light-emitting diode; and forming a light-shielding layer above the thin-film transistor structure in the thin-film transistor structure region so as to block a blue light from entering the thin-film transistor structure.

BRIEF DESCRIPTION OF THE DRAWINGS

In order to clearly illustrate the technical solution of the embodiments of the invention, a brief introduction of the drawings of the embodiments shall be given hereinafter, apparently, the drawings described as follows only relate to some embodiments of the invention, but do not limit the invention.

DETAILED DESCRIPTION

In order to make the object, technical solution and advantages of the embodiments of the invention clearer, the technical solution in the embodiments of the invention shall be clearly and completely described hereinafter in conjunction with the accompanying drawings. Obviously, the described embodiments are part of rather than all of the embodiments of the invention. Based on the embodiments of the invention, all the other embodiments that a person ordinarily skilled in the art obtains without inventive effort are within the scope of the invention.

It should be noted that the following description is given based on one single pixel unit or a plurality of pixel units, but other pixel units can also be formed in the same way.

Figure 1:
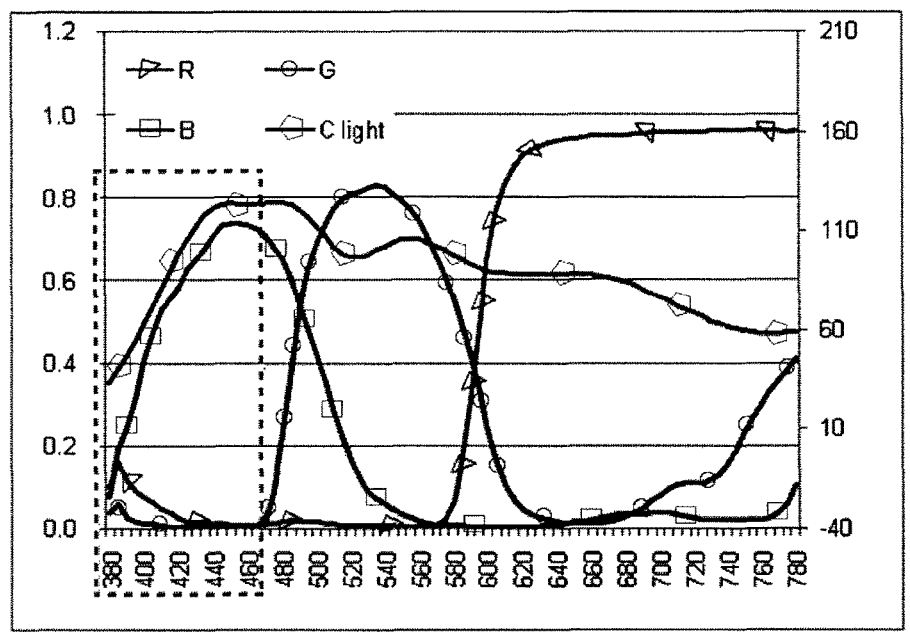
FIG. 1 is a diagram showing the relationship between the wavelengths of a red light, a green light, a blue light and a mixed light (c light) mixed by the red, green and blue light and the transmittance.
Figure 2:
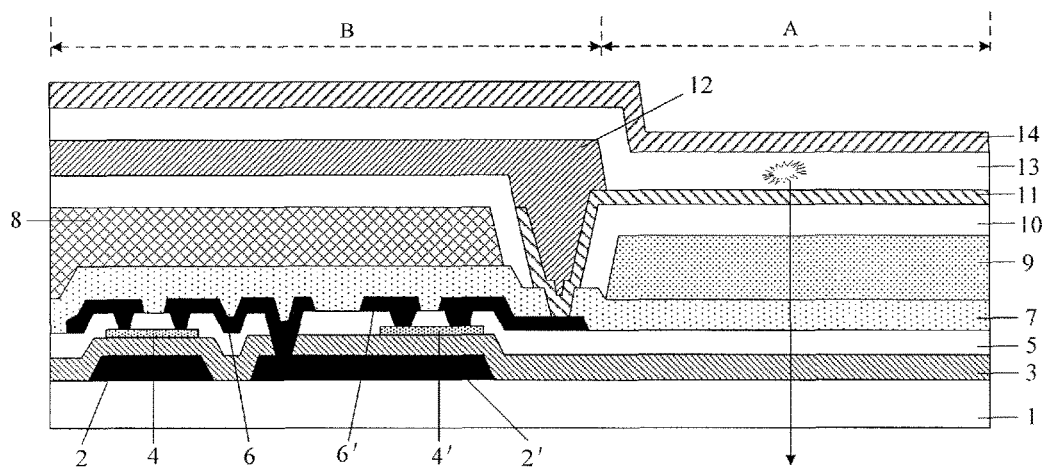
FIG. 2 is a structural schematic diagram showing an array substrate according to an embodiment of the invention.

FIG. 2 is a structural schematic diagram showing an array substrate according to an embodiment of the invention. The array substrate according to the embodiment of the invention comprises a base substrate 1, a plurality of gate lines and a plurality of data lines formed on the base substrate 1, and a plurality of pixel units formed by these gate lines and data lines intersecting with each other. As an example, FIG. 2 merely shows one pixel unit. Each pixel unit comprises a thin-film transistor structure region B and a display region A other than the thin-film transistor structure region B. A thin-film transistor structure is formed in the thin-film transistor structure region B, and an organic light-emitting diode is formed in the display region A. The thin-film transistor structure is configured to drive the organic light-emitting diode. Further referring to FIG. 2, a light-shielding layer 8 is formed above the thin-film transistor structure in the thin-film transistor structure region, so as to prevent a blue light from entering the thin-film transistor structure.

For example, the thin-film transistor structure comprises: a first gate electrode 2 and a second gate electrode 2' formed on the base substrate 1; a gate insulating layer 3 formed on the first gate electrode 2 and the second gate electrode 2'; a first active layer 4 and a second active layer 4' formed on the gate insulating layer 3; an insulating isolation layer 5 formed on the first active layer 4 and the second active layer 4'; and a first source-drain electrode layer 6 (comprising a first source electrode and a first drain electrode) and a second source-drain electrode layer 6' (comprising a second source electrode and a second drain electrode) formed on the insulating isolation layer 5. The first gate electrode 2, the gate insulating layer 3, the first active layer 4, the insulating isolation layer 5 and the first source-drain electrode layer 6 form a switching thin-film transistor (for example, it is an oxide thin-film transistor). The second gate electrode 2', the gate insulating layer 3, the second active layer 4', the insulating isolation layer 5 and the second source-drain electrode layer 6' form a driving thin-film transistor (for example, it is also an oxide thin-film transistor).

For example, the organic light-emitting diode comprises a transparent first electrode 11, an organic light-emitting layer 13 and a second electrode 14, and the organic light-emitting diode is a WOLED. Light emitted from the organic light-emitting layer exits through the first electrode and the respective layers below the first electrode. The first electrode 11 of the organic light-emitting diode is connected to the second drain electrode.

Because only the blue light with shorter wavelength among the light emitted from the WOLED is prevented from affecting characteristics of the thin-film transistor, the light-shielding layer 8 in the embodiment of the invention is used to block the blue light, especially the blue light with a wavelength of 400 nm or less, from entering the thin-film transistor structure. For example, the light-shielding layer 8 is a red filter having a thickness of 5000 Å~40000 Å, a green filter having a thickness of 5000 Å~40000 Å, or a laminated structure of red and green filters having a thickness of 5000 Å~80000 Å, so as to block the blue light from entering the thin-film transistor structure.

Further referring to FIG. 2, a color filter film 9 is further formed in the display region, and the color filter film 9 is disposed below the organic light-emitting diode. For example, the color filter film 9 is provided in the same layer as the light-shielding layer 8 in the thin-film transistor structure region.

The plurality of pixel units comprise pixel units of different colors. For example, the plurality of pixel units comprise a red pixel unit, a green pixel unit and a blue pixel unit. The color filter film 9 in the red pixel unit is a red color filter film, the color filter film 9 in the green pixel unit is a green color filter film, and the color filter film 9 in the blue pixel unit is a blue color filter film. When the light-shielding layer 8 is formed by the red filter, preferably the light-shielding layer 8 is formed at the same time as the color filter film in the red pixel unit. When the light-shielding layer 8 is formed by the green pixel unit, preferably the light-shielding layer 8 is formed at the same time as the color filter film in the green pixel unit. When the light-shielding layer 8 is formed by the laminated structure of red and green filters, preferably the light-shielding layer 8 is formed at the same time as the color filter film in the red pixel unit and the color filter film in the green pixel unit.

Further referring to FIG. 2, the array substrate according to the embodiment of the invention further comprises a passivation layer 7 disposed on the thin-film transistor structure, and the light-shielding layer 8 and the color filter film 9 are formed on the passivation layer 7. In addition, the array substrate according to the embodiment of the invention further comprises: a resin layer 10 formed on the light-shielding layer 8 and the color filter film 9; and a pixel define layer 12 formed on the first electrode 11. The first electrode 11 is connected to the second drain electrode through a via hole penetrating through the resin layer 10 and the passivation layer 7.

In the array substrate according to the embodiment of the invention, the light-shielding layer 8 prevents the blue light from irradiating on the thin-film transistor, but the light with longer wavelength (for example, the red light and green light) is not blocked and can transmit. Therefore, the transmittance is increased while the characteristics of the thin-film transistor are prevented from being affected. As a result, the display effect is improved.

An embodiment of the invention further provides a fabrication method of the above array substrate. The method comprises: forming a thin-film transistor structure in the thin-film transistor structure region B, forming an organic light-emitting diode in the display region A, wherein the thin-film transistor structure is configured to drive the organic light-emitting diode; and forming a light-shielding layer 8 above the thin-film transistor structure in the thin-film transistor structure region so as to block a blue light from entering the thin-film transistor structure.

For example, the thin-film transistor structure comprises: a first gate electrode 2 and a second gate electrode 2' formed on the base substrate 1; a gate insulating layer 3 formed on the first gate electrode 2 and the second gate electrode 2'; a first active layer 4 and a second active layer 4' formed on the gate insulating layer 3; an insulating isolation layer 5 formed on the first active layer 4 and the second active layer 4'; and a first source-drain electrode layer 6 (comprising a first source electrode and a first drain electrode) and a second source-drain electrode layer 6' (comprising a second source electrode and a second drain electrode) formed on the insulating isolation layer 5. The first gate electrode 2, the gate insulating layer 3, the first active layer 4, the insulating isolation layer 5 and the first source-drain electrode layer 6 form a switching thin-film transistor (for example, it is an oxide thin-film transistor). The second gate electrode 2', the gate insulating layer 3, the second active layer 4', the insulating isolation layer 5 and the second source-drain electrode layer 6' form a driving thin-film transistor (for example, it is also an oxide thin-film transistor).

For example, the organic light-emitting diode comprises a transparent first electrode 11, an organic light-emitting layer 13 and a second electrode 14, and the organic light-emitting diode is a WOLED. Light emitted from the organic light-emitting layer exits through the first electrode and the respective layers below the first electrode. The first electrode 11 of the organic light-emitting diode is connected to the second drain electrode.

Because only the blue light with shorter wavelength among the light emitted from the WOLED is prevented from affecting characteristics of the thin-film transistor, the light-shielding layer 8 in the embodiment of the invention is used to block the blue light, especially the blue light with a wavelength of 400 nm or less, from entering the thin-film transistor structure. For example, the light-shielding layer 8 is a red filter having a thickness of 5000 Å~40000 Å, a green filter having a thickness of 5000 Å~40000 Å, or a laminated structure of red and green filters having a thickness of 5000 Å~80000 Å, so as to block the blue light from entering the thin-film transistor structure.

According to the embodiment of the invention, the method further comprises: forming a color filter film 9 in the display region. The color filter film 9 is disposed below the organic light-emitting diode. For example, the color filter film 9 in the display region and the light-shielding layer 8 in the thin-film transistor structure region are provided on a same layer.

The plurality of pixel units comprise pixel units of different colors. For example, the plurality of pixel units comprise a red pixel unit, a green pixel unit and a blue pixel unit. The color filter film 9 in the red pixel unit is a red color filter film, the color filter film 9 in the green pixel unit is a green color filter film, and the color filter film 9 in the blue pixel unit is a blue color filter film. When the light-shielding layer 8 is formed by the red filter, preferably the light-shielding layer 8 is formed at the same time as the color filter film in the red pixel unit. When the light-shielding layer 8 is formed by the green pixel unit, preferably the light-shielding layer 8 is formed at the same time as the color filter film in the green pixel unit. When the light-shielding layer 8 is formed by the laminated structure of red and green filters, preferably the light-shielding layer 8 is formed at the same time as the color filter film in the red pixel unit and the color filter film in the green pixel unit.

According to the embodiment of the invention, the method further comprises: forming a passivation layer 7. The passivation layer 7 is disposed on the thin-film transistor structure, and the light-shielding layer 8 and the color filter film 9 are formed on the passivation layer 7. In addition, according to the embodiment of the invention, the method further comprises: forming a resin layer 10 on the light-shielding layer 8 and the color filter film 9, and forming a pixel define layer 12 on the first electrode 11. The first electrode 11 is connected to the second drain electrode through a via hole penetrating through the resin layer 10 and the passivation layer 7.

Hereinafter, the fabrication method of the array substrate according to the embodiment of the invention will be described in detail in conjunction with the accompanying drawings.

Figure 3:
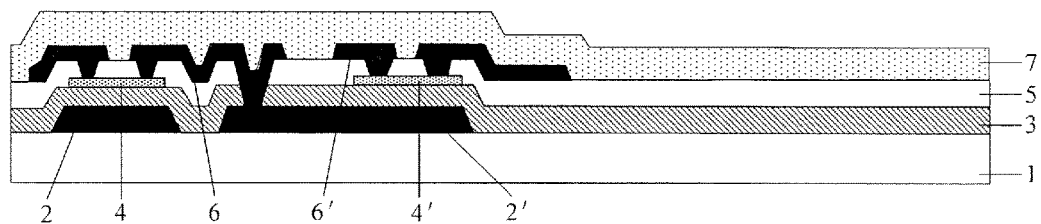
FIG. 3 is a schematic diagram showing forming a thin-film transistor structure and a passivation layer on a base substrate in a fabrication method of an array substrate according to an embodiment of the invention.

At first, the thin-film transistor and the passivation layer 7 are formed on the substrate 1, as shown in FIG. 3.

Figure 4:
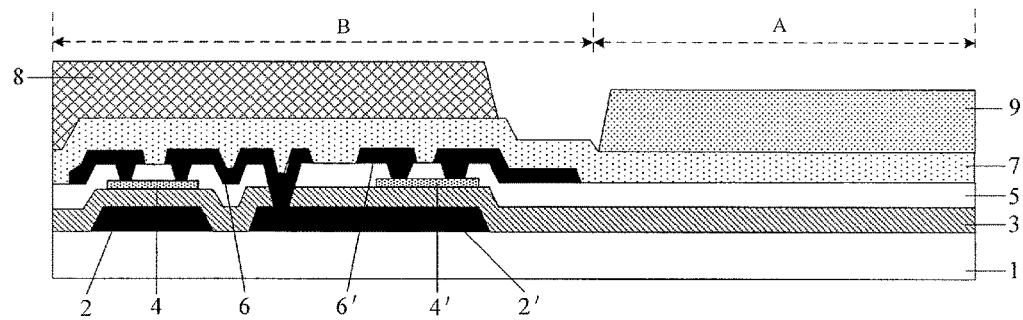
FIG. 4 is a schematic diagram showing forming a color filter film and a light-shielding layer in the fabrication method of the array substrate according to the embodiment of the invention.

Then, the color filter film 9 and the light-shielding layer 8 are formed on the passivation layer 7, as shown in FIG. 4.

The color filter films 9 in the plurality of pixel units are formed through multiple patterning processes and each patterning process forms the color filter film in the pixel unit of one color. Furthermore, during forming the color filter films in the display region through patterning processes, the light-shielding layer 8 is formed in the thin-film structure region B.

For example, the plurality of pixel units comprise the red pixel unit, the green pixel unit and the blue pixel unit. The color filter film 9 in the red pixel unit is the red color filter film, the color filter film 9 in the green pixel unit is the green color filter film, and the color filter film 9 in the blue pixel unit is the blue color filter film.

For example, during the color filter film 9 in the red pixel unit is formed through a patterning process, the red filter is formed in the thin-film structure region B as the light-shielding layer 8. That is, a red filter film is formed on the passivation layer 7, and the patterning process is performed on the red filter film so that the color filter film of the red pixel unit and the red filter for blocking the blue light are respectively formed in the display region A and the thin-film structure region B at the same time.

For example, during the color filter film 9 in the green pixel unit is formed through a patterning process, the green filter is formed in the thin-film structure region B as the light-shielding layer 8. That is, a green filter film is formed on the passivation layer 7, and the patterning process is performed on the green filter film so that the color filter film of the green pixel unit and the green filter for blocking the blue light are respectively formed in the display region A and the thin-film structure region B at the same time.

For example, during the color filter film 9 in the red pixel unit and the color filter film 9 in the green pixel unit are formed through patterning processes, the laminated structure of red and green filters is formed in the thin-film structure region B as the light-shielding layer 8. That is, the green filter film is formed on the passivation layer 7, and the patterning process is performed on the green filter film so that the color filter film of the green pixel unit and the green filter for blocking the blue light are respectively formed in the display region A and the thin-film structure region B at the same time; then the red filter film is formed on the passivation layer 7, and the patterning process is performed on the red filter film so that the color filter film of the red pixel unit and the red filter for blocking the blue light are respectively formed in the display region A and the thin-film structure region B at the same time. In this way, the laminated structure of red and green filters is formed. It should be noted that the red filter may be formed firstly, and then the green filter is formed.

Finally, an organic light-emitting diode is formed in the display region A of the pixel unit. For example, this step may be performed in the following way.

Figure 5:
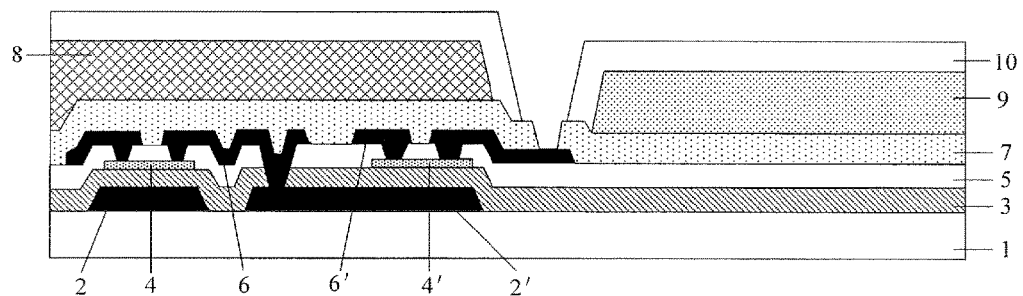
FIG. 5 is a schematic diagram showing forming a resin layer and a via hole in the fabrication method of the array substrate according to the embodiment of the invention.

As shown in FIG. 5, a via hole is formed in the passivation layer 7 through a patterning process. In addition, a resin layer 10 may be formed on the color filter film 9 and the light-shielding layer 8, and in this case, the via hole is formed to penetrate through the passivation layer 7 and the resin layer 10.

Figure 6:
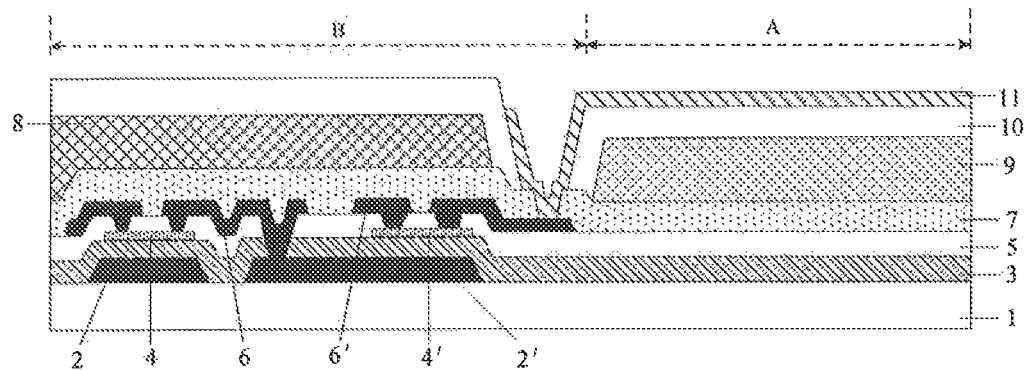
FIG. 6 is a schematic diagram showing forming a first electrode of an organic light-emitting diode in the fabrication method of the array substrate according to the embodiment of the invention.

As shown in FIG. 6, a transparent conductive film is formed, and the first electrode 11 of the organic light-emitting diode is formed by performing a patterning process on the transparent conductive film. The first electrode 11 is connected to the thin-film transistor structure through the via hole, to be specific, the first electrode 11 is connected to the drain electrode of the driving thin-film transistor through the via hole.

Figure 7:
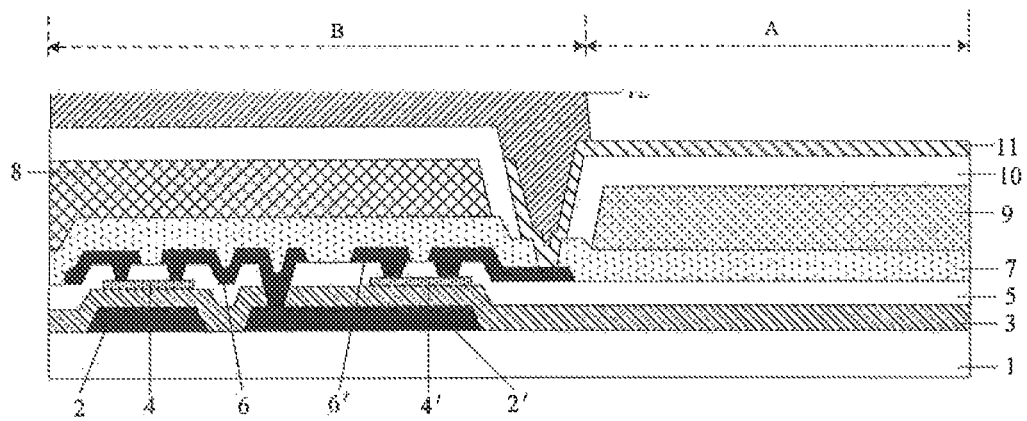
FIG. 7 is a schematic diagram showing forming a pixel define layer in the fabrication method of the array substrate according to the embodiment of the invention.

As shown in FIG. 7, an insulating film is formed, and the pixel define layer 12 is formed by performing a patterning process on the insulating film. The pixel define layer 12 is used to limit the organic light-emitting diode to be formed within the display region A.

Then, the organic light-emitting layer 13 and the second electrode 14 of the organic light-emitting diode are formed so as to complete the formation of the organic light-emitting diode. The resultant array substrate is shown in FIG. 2.

In the fabrication method of the array substrate according to the embodiment of the invention, the light-shielding layer 8 prevents the blue light from irradiating on the thin-film transistor, but the light with longer wavelength (for example, the red light and green light) is not blocked and can transmit. Therefore, the transmittance is increased while the characteristics of the thin-film transistor are prevented from being affected. As a result, the display effect is improved.

An embodiment of the invention further provides a display device, the display device comprises the above array substrate. The display device may be any product or component having a display function such as e-paper, OLED panel, OLED display, OLED television, digital photo frame, mobile phone, tablet computer and the like.

The foregoing embodiments merely are exemplary embodiments of the invention, and not intended to define the scope of the invention, and the scope of the invention is determined by the appended claims.

What is claimed is:

1. An array substrate, comprising a plurality of pixel units disposed on a base substrate,
    a color of light omitted by each pixel unit being one of red, green and blue, the pixel unit comprising a thin-film transistor structure region and a display region other than the thin-film transistor structure region, wherein
    a thin-film transistor structure is formed in the thin-film transistor structure region, an organic light-emitting diode is formed in the display region, and the thin-film transistor structure is configured to drive the organic light-emitting diode,
    a light-shielding layer is formed directly above and covering the thin-film transistor structure in the thin-film transistor structure region of each of the pixel units, and the light-shielding layer of each of the pixel units is configured to block a blue light from entering the thin-fiim transistor structure,
    a color filter film is further formed in the display region, and the color filter film is disposed below the organic light-emitting diode, and
    the light-shielding layer of each of the pixel units and the color filter film are provided in a same layer.

2. The array substrate according to claim 1, wherein the light-shielding layer is configured to block the blue light with a wavelength of 400 nm or less.

3. The array substrate according to claim 1, wherein the light-shielding layer is a red filter.

4. The array substrate according to claim 3, wherein the red filter has a thickness of 5000 Å~40000 Å.

5. The array substrate according to claim 1, wherein the light-shielding layer is a green filter.

6. The array substrate according to claim 5, wherein the green filter has a thickness of 5000 Å~40000 Å.

7. The array substrate according to claim 1, wherein the light-shielding layer is a laminated structure of red and green filters.

8. The array substrate according to claim 7, wherein the laminated structure of red and green filters has a thickness of 5000 Å~80000 Å.

9. The array substrate according to claim 1, wherein
    the pixel units comprise a red pixel unit, and the color filter film in the red pixel unit is a red color filter film;
    the light-shielding layer is formed by a red filter, and the red filter is formed at the same time as the color filter film in the red pixel unit.

10. The array substrate according to claim 1, wherein
    the pixel units comprise a green pixel unit, and the color filter film in the green pixel unit is a green color filter film;

the light-shielding layer is formed by a green filter, and the green filter is formed at the same time as the color filter film in the green pixel unit.

11. The array substrate according to claim 1, wherein
the pixel units comprise a red pixel unit and a green pixel unit, the color filter film in the red pixel unit is a red color filter film, and the color filter film in the green pixel unit is a green color filter film;
the light-shielding layer is formed by a laminated structure of red and green filters, and the laminated structure of red and green filters is formed at the same time as the color filter film in the red pixel unit and the color filter film in the green pixel unit.

12. The array substrate according to claim 1, wherein
the array substrate further comprises a passivation layer, the passivation layer is disposed on the thin-film transistor structure, and the light-shielding layer and the color filter film are formed on the passivation layer;
a via hole is formed in the passivation layer so that the organic light-emitting diode is connected to the thin-film transistor structure through the via hole.

13. The array substrate according to claim 1, wherein
the array substrate further comprises a resin layer formed on the light-shielding layer and color filter film;
a via hole is formed in the resin layer so that the organic light-emitting diode is connected to the thin-film transistor structure through the via hole.

14. The array substrate according to claim 1, wherein the thin-film transistor structure comprises: a first gate electrode and a second gate electrode formed on the base substrate; a gate insulating layer formed on the first gate electrode and the second gate electrode; a first active layer and a second active layer formed on the gate insulating layer; an insulating isolation layer formed on the first active layer and the second active layer; a first source electrode and a first drain electrode formed on the insulating isolation layer and corresponding to the first active layer, and a second source electrode and a second drain electrode formed on the insulating isolation layer and corresponding to the second active layer;
the first drain electrode is connected to the second gate electrode, the first gate electrode, the gate insulating layer, the first active layer, the insulating isolation layer, the first source electrode and first drain electrode form a switching thin-film transistor, the second gate electrode, the gate insulating layer, the second active layer, the insulating isolation layer, the second source electrode and the second drain electrode form a driving thin-film transistor; and
the organic light-emitting diode comprises a transparent first electrode, a light-emitting layer and a second electrode, and the first electrode is connected to the second drain electrode.

15. The array substrate according to claim 14, wherein the array substrate further comprises a pixel define layer formed on the first electrode.

16. A display device, comprising the array substrate according to claim 1.

17. An array substrate, comprising a plurality of pixel units disposed on a base substrate,
a color of light emitted by each pixel unit being one of red, green and blue,
the pixel unit comprising a thin-film transistor structure region and a display region other than the thin-film transistor structure region, wherein
a thin-film transistor structure is formed in the thin-film transistor structure region, an organic light-emitting diode is formed in the display region, and the thin-film transistor structure is configured to drive the organic light-emitting diode,
a light-shielding layer is formed directly above and covering the thin-film transistor structure in the thin-film transistor structure region of each of the pixel units, and the light-shielding layer of each of the pixel units is configured to block a blue light from entering the thin-film transistor structure,
a color filter film is further formed in the display region, and the color filter film is disposed below the organic light-emitting diode, and
the light-shielding layer is a laminated structure of red and green filters.

18. The array substrate according to claim 1, wherein
a light-emitting layer of the organic light-emitting diode formed hi the display region is in a continuous structure.

19. The array substrate according to claim 1, wherein
the light-shielding layer formed in the thin-film transistor structure region of each of the pixel units is hi a continuous structure, and an orthographic projection of an active layer of the thin-film transistor structure formed hi the thin-film transistor structure region of each of the pixel units on the base substrate is within an orthographic projection of the light-shielding layer on the base substrate.

20. The array substrate according to claim 19, wherein
the light-shielding layer formed in the thin-film transistor structure region of each of the pixel units is configured to block blue light emitted by the organic light-emitting diode formed in the display region from entering the thin-film transistor structure formed in the thin-film transistor structure region.

* * * * *